United States Patent
Murata et al.

(10) Patent No.: US 8,558,435 B2
(45) Date of Patent: Oct. 15, 2013

(54) PACKAGE STRUCTURE OF A PIEZOELECTRIC DEVICE MOUNTING AND SUPPORTING A PIEZOELECTRIC VIBRATION ELEMENT

(75) Inventors: Kazuo Murata, Saitama (JP); Kazuhiro Toriumi, Nagano (JP); Toshiya Kubo, Nagano (JP); Takashi Maruyama, Nagano (JP); Tomoyuki Nakazawa, Nagano (JP); Taichi Tsuchiya, Nagano (JP); Izumi Yamamoto, Saitama (JP); Akiko Katoh, Tokyo (JP); Sadao Horiuchi, Saitama (JP); Hiroshi Miyauchi, Saitama (JP); Isao Arai, Saitama (JP); Akihiro Shioji, Tokyo (JP); Tomoo Ikeda, Saitama (JP); Maki Takizawa, Saitama (JP); Keisuke Kigawa, Saitama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 433 days.

(21) Appl. No.: 12/922,592

(22) PCT Filed: Mar. 17, 2009

(86) PCT No.: PCT/JP2009/055150
§ 371 (c)(1),
(2), (4) Date: Sep. 14, 2010

(87) PCT Pub. No.: WO2009/116523
PCT Pub. Date: Sep. 24, 2009

(65) Prior Publication Data
US 2011/0018399 A1    Jan. 27, 2011

(30) Foreign Application Priority Data
Mar. 18, 2008   (JP) .................................. 2008-068895

(51) Int. Cl.
*H03H 9/19*    (2006.01)

(52) U.S. Cl.
CPC ........................................ *H03H 9/19* (2013.01)
USPC ........................................................ 310/370

(58) Field of Classification Search
USPC ........................................................ 310/370
See application file for complete search history.

(56) References Cited

U.S. PATENT DOCUMENTS 6,125,701 A * 10/2000 Sugitani et al. ............. 73/504.16
6,700,313 B2 * 3/2004 Dalla Piazza et al. ........ 310/370

(Continued)

FOREIGN PATENT DOCUMENTS

EP          1732217 A1   12/2006
JP        06117862 A *    4/1994

(Continued)

OTHER PUBLICATIONS

International Search Report of PCT/JP2009/055150, mailing date Jun. 16, 2009.

(Continued)

*Primary Examiner* — Jaydi San Martin
(74) *Attorney, Agent, or Firm* — Westerman, Hattori, Daniels & Adrian, LLP

(57) ABSTRACT

A piezoelectric device has a piezoelectric vibration element mounted in a package wherein the piezoelectric vibration element comprises two stick-like vibration legs; a central leg provided between the two vibration legs; a coupling portion that couples one end of each of the two vibration legs and one end of the central leg; and a protrusion portion that is coupled to another end of the central leg, has a predetermined angle, neither 0 nor 180 degrees, to the length direction of the central leg, and extends into a direction not interfering with the driving legs. In making the piezoelectric device smaller and thinner, this configuration avoids interference between a support point on the central leg, provided for supporting the vibration element, and conductive electrodes, improves insulation between the conductive electrodes, and reduces the generation of short-circuits between the conductive electrodes.

20 Claims, 18 Drawing Sheets

(56) References Cited

U.S. PATENT DOCUMENTS

| | | | |
|---|---|---|---|
| 7,015,631 B2 | 3/2006 | Hirasawa et al. | |
| 7,084,556 B1 * | 8/2006 | Dalla Piazza et al. | 310/370 |
| 7,138,752 B1 * | 11/2006 | Dalla Piazza et al. | 310/370 |
| 7,939,995 B2 * | 5/2011 | Dalla Piazza | 310/370 |
| 8,053,957 B2 * | 11/2011 | Sugiyama | 310/370 |
| 8,067,880 B2 * | 11/2011 | Yamada | 310/370 |
| 8,169,127 B2 * | 5/2012 | Yamada | 310/370 |
| 8,174,171 B2 * | 5/2012 | Iwai | 310/370 |
| 8,227,958 B2 * | 7/2012 | Inoue et al. | 310/344 |
| 2003/0067248 A1 | 4/2003 | Dalla Piazza et al. | |
| 2005/0062368 A1 | 3/2005 | Hirasawa et al. | |
| 2006/0279176 A1 * | 12/2006 | Dalla Piazza et al. | 310/348 |
| 2012/0024060 A1 * | 2/2012 | Janiaud et al. | 73/504.15 |

FOREIGN PATENT DOCUMENTS

| | | | |
|---|---|---|---|
| JP | 2002-141770 A | | 5/2002 |
| JP | 2002-151994 A | | 5/2002 |
| JP | 2003-163568 A | | 6/2003 |
| JP | 2005-102138 A | | 4/2005 |
| JP | 2006-345519 A | | 12/2006 |
| JP | 2006345519 A | * | 12/2006 |
| JP | 2009-147935 A | | 7/2009 |
| JP | 2009147935 A | * | 7/2009 |
| JP | 2012135021 A | * | 7/2012 |
| JP | 2012147329 A | * | 8/2012 |

OTHER PUBLICATIONS

Written Opinion of PCT/JP2009/055150, mailing date Jun. 16, 2009.

Notification of Transmittal of Translation of the International Preliminary Report on Patentability (forms PCT/IB/338) of International Application No. PCT/JP2009/055150 mailed Nov. 11, 2010 with Forms PCT/IB/373 and PCT/ISA/237.

* cited by examiner

FREE-FALL DROP TEST FROM HEIGHT OF 75cm
ONTO HARD WOODEN BOARD PERFORMED THREE TIMES

FREE-FALL DROP TEST FROM HEIGHT OF 75cm
ONTO HARD WOODEN BOARD PERFORMED THREE TIMES

PACKAGE STRUCTURE OF A PIEZOELECTRIC DEVICE MOUNTING AND SUPPORTING A PIEZOELECTRIC VIBRATION ELEMENT

TECHNICAL FIELD

The present invention relates to the package structure of a piezoelectric device, and more particularly to a package having a mounting portion that is an electrical contact for electrically and mechanically supporting and fixing a piezoelectric vibration element as well as a supporting portion that mechanically supports and fixes the piezoelectric vibration element.

BACKGROUND ART

A recent trend toward a small, thin mobile device leads to a strong demand for a small, thin piezoelectric device used in the device.

FIG. 17 is a diagram showing a piezoelectric device in the prior art. As shown in FIG. 17A, a piezoelectric device 50 in the prior art comprises a package 53 that has a cavity 52 for storing a piezoelectric vibration element 51 and a mounting stand 58 that has an electrode 57 connected electrically to an external connection terminal 56; the piezoelectric vibration element 51 one end of which is supported and fixed on the electrode 57, formed on the mounting stand 58, using a conductive adhesive 55; and a lid 54 for hermetically sealing the package 53.

In the case of the piezoelectric device 50 shown in FIG. 17A, the electrode 57 that functions as the mounting portion for supporting and fixing the piezoelectric vibration element 51 is provided in a position away from the center of gravity of the piezoelectric vibration element 51. Because the conductive adhesive 55 used generally for fixing the piezoelectric vibration element 51 is liquid in many cases, the unsupported, unfixed end of the piezoelectric vibration element 51 easily hangs down due to the weight of the piezoelectric vibration element 51 itself, as shown in FIG. 17B, after applying the conductive adhesive 55 to the electrode 57 and then mounting the piezoelectric vibration element 51 in a predetermined position but before heat-hardening the adhesive.

The unsupported, unfixed end of the piezoelectric vibration element 51, which hangs down as shown in FIG. 17B, comes into contact with the bottom face of the cavity 52 of the package 53, causing deterioration in the characteristics of the piezoelectric device 50. To solve this problem, the structure is employed in which the mounting stand 58 is formed in the package 53 to provide space between the bottom face of the cavity 52 and the piezoelectric vibration element 51 so that the end of the piezoelectric vibration element 51 does not come into contact with the bottom face of the cavity 52 even when it hangs down. However, the problem with this structure is that the mounting stand 58, if provided, prevents the piezoelectric device 50 from becoming thinner.

Therefore, to provide a thin piezoelectric device, the configuration is proposed in which the central leg is provided between two vibration legs and this central leg supports the piezoelectric device. For example, Patent Document 1 discloses a piezoelectric device having the configuration in which the piezoelectric device is supported at one point that is the center of gravity of the central leg provided between two vibration legs, and Patent Document 2 discloses a piezoelectric device having the configuration in which the piezoelectric device is supported at two points on the central leg.

FIG. 18 is a diagram showing the structure of a piezoelectric device in another prior art described in Patent Document 2.

FIG. 18 is a top view showing the piezoelectric device in the prior art. As shown in FIG. 18, a piezoelectric vibration element 61 in the prior art has a central leg 61b between two vibration legs 61a, and electrodes 64 provided on this central leg 61b are electrically and mechanically supported and fixed on two conductive pads 66, electrically connected to external connection terminals (not shown), using conductive adhesive 65. In the package, the piezoelectric vibration element 61 is supported and fixed in the same positions where the electrodes 64 are formed.

This configuration prevents the leading end of the piezoelectric vibration element from hanging down and coming into contact with the bottom face of the cavity, as shown in the example in the prior art shown in FIG. 17, when the piezoelectric vibration element is installed in the package.

Patent Document 1: Japanese Patent Laid-Open Publication No. 2003-163568
Patent Document 2: Japanese Patent Laid-Open Publication No. 2006-345519

DISCLOSURE OF THE INVENTION

Problems to be Solved by the Invention

However, in the piezoelectric device in the prior art described above, adequate consideration has not been given to the insulation between the conductive electrodes of the vibration element and so the problem is that a short circuit may occur between the conductive electrodes. In the configuration in which the piezoelectric device is supported using the central leg, the problem with the insulation between the conductive electrodes becomes even more evident as the piezoelectric device becomes smaller and thinner.

For example, in the configuration disclosed in Patent Document 1 in which the conductive portions are provided on the central leg, the space where conductive electrodes are placed on the central leg becomes limited as the piezoelectric device becomes smaller and thinner. This makes it more difficult to insulate between the conductive electrodes, thus increasing the possibility that a short circuit may occur between the conductive electrodes.

In the configuration disclosed in Patent Document 2 in which the conductive electrodes are formed in the same position where the support points are provided on the central leg, the problem is that the space for forming the conductive electrodes becomes limited. In addition, the space for forming the conductive electrodes becomes more limited as the piezoelectric device becomes smaller and thinner, resulting in the problem that a short circuit will occur more easily between the conductive electrodes.

In view of the foregoing, it is an object of the present invention to improve the insulation properties between the conductive electrodes and to reduce the generation of a short circuit between the conductive electrodes with consideration for the trend toward a smaller, thinner piezoelectric device.

It is another object of the present invention to avoid interference between a support point, which supports the vibration element on the central leg, and a conductive electrode and to improve the resistance of insulation between the conductive electrodes with consideration for the trend toward a smaller, thinner piezoelectric device.

Means to Solve the Problems

To achieve the above objects, a piezoelectric device of the present invention is a piezoelectric device in which a piezoelectric vibration element is mounted in a package. This piezoelectric vibration element comprises two stick-like vibration legs; a central leg provided between the two vibration legs; a coupling portion that couples one end of each of the two vibration legs and one end of the central leg; and a protrusion portion that is coupled to another end of the central leg, has a predetermined angle, except 0 and 180 degrees, to the length direction of the central leg, and extends into a direction not interfering with the vibration legs.

In the configuration described above, the piezoelectric vibration element of the present invention is fixed in the package by a support point on the central leg of the piezoelectric vibration element. The piezoelectric vibration element is electrically conducted to the package through the connection to the external connection terminals, provided on the side of the package, via two conducting points on the protrusion portion.

This configuration allows the support point, which supports the piezoelectric device, and the conductive point on the central leg to be spaced a predetermined distance to avoid interference between the support point and the conductive point and to form the electrode of the conducting point in a sufficient space.

The piezoelectric device of the present invention is configured such that the central leg is supported in the package at a support point in a range in which temperature characteristics of the piezoelectric vibration element are stable.

The piezoelectric device has the problem that the dynamic stability characteristics, such as the temperature characteristics involved when the vibration elements vibrate, are deteriorated as the temperature changes, for example, the frequency characteristics vary or the CI value increases. The problem of the dynamic stability characteristics become more serious as the piezoelectric device becomes smaller and thinner.

The piezoelectric device of the present invention is configured such that the piezoelectric vibration element is supported in the package, by the support point on the central leg by supporting the piezoelectric vibration element in the package by the support point in the range in which the temperature characteristics of the piezoelectric vibration element are stable. Setting the position of this support point in the range in which the temperature characteristics of the piezoelectric vibration element are stable reduces deterioration in the temperature characteristics of the piezoelectric device, such as the frequency characteristics and the CI characteristics, even when the piezoelectric device is made even smaller and thinner.

The piezoelectric device of the present invention may be configured in such a way that the piezoelectric vibration element is supported and fixed in the package by at least two support points of one support point on the central leg and at least one support point on the protrusion portion.

The piezoelectric device of the present invention may be configured in such a way that the piezoelectric vibration element has two protrusion portions extending into both sides of the central leg and that the piezoelectric vibration element is supported and fixed in the package by three points of one support point on the central leg, one support point on one protrusion portion of the two protrusion portions, and one support point on another protrusion portion.

This configuration prevents the piezoelectric vibration element, once installed, from tilting and from coming into contact with the bottom face of the cavity of the package, thus preventing the characteristics of the piezoelectric device from being deteriorated. Preventing the piezoelectric vibration element from tilting, in turn, eliminates the need for the mounting portion of the piezoelectric vibration element to be unnecessarily away from the bottom face of the package, thereby resulting in an even thinner piezoelectric device.

In a first mode, the piezoelectric device of the present invention suppresses the central leg vibration mode to suppress deterioration in the temperature characteristics such as the frequency characteristics and the CI characteristics.

In the central leg vibration mode that is the vibration mode in which the central leg bends and vibrates on the principal surface, an actual vibration is not usually generated because the CI value is high. However, coupling that is caused when the resonance frequency becomes closer to the basic frequency of the piezoelectric vibration element generates an actual vibration and causes CI deterioration. The vibration frequency of the central leg has the characteristics that, as the temperature rises, the vibration frequency becomes closer to the basic frequency of the piezoelectric vibration element. When the vibration frequency of the central leg becomes closer to the basic frequency of the piezoelectric vibration element, coupling occurs and this coupling prevents the piezoelectric vibration element from oscillating stably.

The inventors of the present application have found that the generation of the central leg vibration mode depends on the distance between the coupling portion, which couples the central leg and the vibration legs, and the support point on the central leg and that setting the support point near to the coupling portion suppresses the generation of the central leg vibration mode. This is because the shorter the distance between the coupling portion and the support point is, the higher the resonance frequency of the central leg mode becomes and, so, making the distance sufficiently short prevents the resonance frequency from being coupled with the basic frequency in a usual temperature range.

In the first mode, the piezoelectric device of the present invention sets the position of the support point on the central leg from the coupling portion at a position near to the coupling portion in such a way that the distance from the coupling portion is shorter than the distance that would induce a vibration resonance between the vibration legs and the central leg when the vibration frequency of the central leg becomes closer to the basic vibration frequency of the vibration legs. With this position of the support point as a position in the range in which the temperature characteristics are stable, the piezoelectric device suppresses the generation of the central leg vibration mode and thereby suppresses deterioration in the temperature characteristics.

In the first mode, the piezoelectric device of the present invention sets the distance between the support point on the central leg and the coupling portion shorter than the distance that would induce a vibration resonance between the vibration legs and the central leg when the vibration frequency of the central leg becomes closest to the basic vibration frequency of the vibration legs within an allowable temperature range in terms of variation characteristics of the vibration frequency of the central leg for the temperature. With this position as a position in the range in which the temperature characteristics are stable, the piezoelectric device suppresses the generation of the central leg vibration mode and thereby suppresses deterioration in the temperature characteristics such as the frequency characteristics and the CI characteristics.

In a second mode, the piezoelectric device of the present invention can suppress deterioration in the temperature characteristics, such as the frequency characteristics and the CI characteristics of the piezoelectric device, based on the variation characteristics of the vibration frequency of the vibration legs with respect to the support position on the central leg.

In a second mode, the piezoelectric device of the present invention sets the position of the support point on the central leg from the coupling portion at a position where, in terms of variation characteristics of the vibration frequency of the vibration legs with respect to the support position on the central leg, the distance is small enough to ignore the variation in the variation frequency. With this position as a position in the range in which the temperature characteristics are stable, the piezoelectric device suppresses deterioration in the temperature characteristics such as the frequency characteristics and the CI characteristics.

In the second mode, the piezoelectric device of the present invention sets the position of the support point on the central leg from the coupling portion at a position where the distance is large enough to ignore an increase in the CI value with respect to the support position on the central leg for suppressing an increase in the CI value generated by central leg supporting.

The mode of the piezoelectric device of the present invention may be a combination of the first mode and the second mode.

The piezoelectric device of the present invention sets the position of the support point on the central leg at a position near to the coupling portion in such a way that the distance between the support point and the coupling portion is shorter than the distance that would induce a vibration resonance between the vibration legs and the central leg when the vibration frequency of the central leg becomes closer to the basic vibration frequency of the vibration legs and, at the same time, at a position where, in terms of the variation characteristics of the vibration frequency of the vibration legs with respect to the support position on the central leg, the distance is small enough to ignore the variation in the variation frequency. With this position as a position in the range in which the temperature characteristics are stable, the piezoelectric device suppresses deterioration in the temperature characteristics such as the frequency characteristics and the CI characteristics.

The piezoelectric device of the present invention sets the position of the support point on the central leg at a position near to the coupling portion in such a way that the distance between the support point and the coupling portion is shorter than the distance that would induce a vibration resonance between the vibration legs and the central leg when the vibration frequency of the central leg becomes closer to the basic vibration frequency of the vibration legs and, at the same time, at a position where the distance is large enough to ignore an increase in the CI value with respect the support position on the central leg for suppressing deterioration in the temperature characteristics and for suppressing an increase in the CI value generated by central leg supporting.

The piezoelectric device of the present invention supports and fixes the piezoelectric vibration element in the package by means of at least two mounting portions electrically connected to an external connection terminal formed in the package and at least one supporting portion that is electrically insulated from the external connection terminal wherein the piezoelectric vibration element is supported and fixed in the package by the mounting portions and the supporting portion.

This configuration allows the supporting portion to be electrically insulated from the external connection electrode, preventing an external unwanted electrical signal from arriving at the piezoelectric vibration element.

The piezoelectric device of the present invention comprises a pedestal on which the piezoelectric vibration element is mounted and the pedestal comprises a mounting stand where an electrode is formed on a surface thereof on which the mounting portion is formed; and a projection that forms the supporting portion. At least one of the mounting stand and the projection is integrally formed with the package.

This configuration allows the mounting stand and the projection, which works as the supporting portion, to be produced continuously with the formation of the cavity of the package, thus increasing the production efficiency of packages.

The piezoelectric device of the present invention may have a structure in which at least one of the mounting portions and the supporting portion is made of a thin film or a plating material formed on the package.

This configuration eliminates the need for step machining for the mounting portions and the supporting portion, making the piezoelectric device even thinner.

The piezoelectric device of the present invention may be produced by supporting and fixing the piezoelectric vibration element on the mounting portions and the supporting portion using elastic adhesive.

This configuration allows an impact on the piezoelectric vibration element to be absorbed by the elastic adhesive, increasing the reliability of the piezoelectric device such as dropping impact resistance.

The piezoelectric device of the present invention may be produced by supporting and fixing the piezoelectric vibration element on the mounting portions and the supporting portion using a metal bump.

This configuration allows a metal material to be used for the fixing member for supporting and fixing the piezoelectric vibration element on the mounting portions or the supporting portion, thus reducing the possibility of degassing from the fixing member and thereby providing a piezoelectric device having stable characteristics.

The piezoelectric device of the present invention may have a structure in which the cross section of at least one of the mounting portions and the supporting portion is concave or convex.

Even if the adhesive used for supporting and fixing the piezoelectric vibration element on the mounting portions or the supporting portion is excessive, this configuration allows the adhesive to be held in the spacing between the piezoelectric vibration element and the concave or convex part on the mounting portions or supporting portion. This prevents the run-out adhesive from causing an electrical short-circuit or from adhering onto an anti-pollution area of the piezoelectric vibration element.

The piezoelectric device of the present invention may have a structure in which the surface of the supporting portion is covered by an insulating material.

This configuration ensures electrical insulation between the piezoelectric vibration element and supporting portion even if the supporting portion is made of a conductive material.

The piezoelectric device of the present invention may be produced by supporting and fixing the piezoelectric vibration element on the supporting portion using insulating adhesive.

This configuration ensures electrical insulation between the piezoelectric vibration element and supporting portion even if the supporting portion is made of a conductive material.

The piezoelectric device of the present invention may have a structure in which the configuration member of the package is a semiconductor.

This configuration makes it possible to perform collective processing on a wafer basis through the semiconductor photo-lithography process and to process a large number of piezoelectric devices at a time, thereby reducing the fabrication cost.

The piezoelectric device of the present invention may comprise a tuning-fork type quartz crystal vibration element, which has a vibration portion and a fixed portion, as the piezoelectric device.

This configuration enables the non-vibrating portion of the piezoelectric vibration element to be supported and fixed, thus making it possible to fabricate a piezoelectric device that has stable characteristics.

The piezoelectric device of the present invention may comprise a tuning-fork type quartz crystal vibration element as the piezoelectric vibration element wherein the piezoelectric vibration element comprising two stick-like vibration legs; a central leg provided between the two vibration legs; a coupling portion that couples one end of each of the two vibration legs and one end of the central leg; and a fixed leg coupled to the end of the central leg not coupled to the coupling portion.

This configuration enables the non-vibrating portions of the piezoelectric vibration element to be supported and fixed, thus making it possible to fabricate a piezoelectric device that has stable characteristics.

The piezoelectric device of the present invention allows the fixed leg of the tuning-fork type quartz crystal vibration element to be supported and fixed on the two mounting portions, and the central leg to be supported and fixed on the supporting portion.

This configuration allows the non-vibrating portions of the piezoelectric vibration element to be supported and fixed, more efficiently prevents the piezoelectric vibration element from tilting, and prevents the characteristics of the piezoelectric device from being deteriorated.

The piezoelectric device of the present invention may comprise an AT-cut quartz crystal vibration element as the piezoelectric vibration element.

This configuration provides a high-frequency band piezoelectric device using the oscillation frequency of the AT-cut quartz crystal vibration element.

According to the mode of the present invention, because the piezoelectric vibration element is supported and fixed by at least three points not on the same straight line, the piezoelectric vibration element, once mounted in the package, neither tilts nor comes into contact with the package. In addition, because there is no need to provide the mounting portion of the piezoelectric vibration element unnecessarily away from the bottom face of the package, the characteristics are not deteriorated and therefore the piezoelectric device is made even thinner.

Effect of the Invention

According to the present invention, the piezoelectric vibration element is supported stably, the generation of short-circuits between the conductive electrodes is reduced, and the piezoelectric device may be made even smaller and thinner.

DESCRIPTION OF REFERENCE NUMERALS

Figure 1:
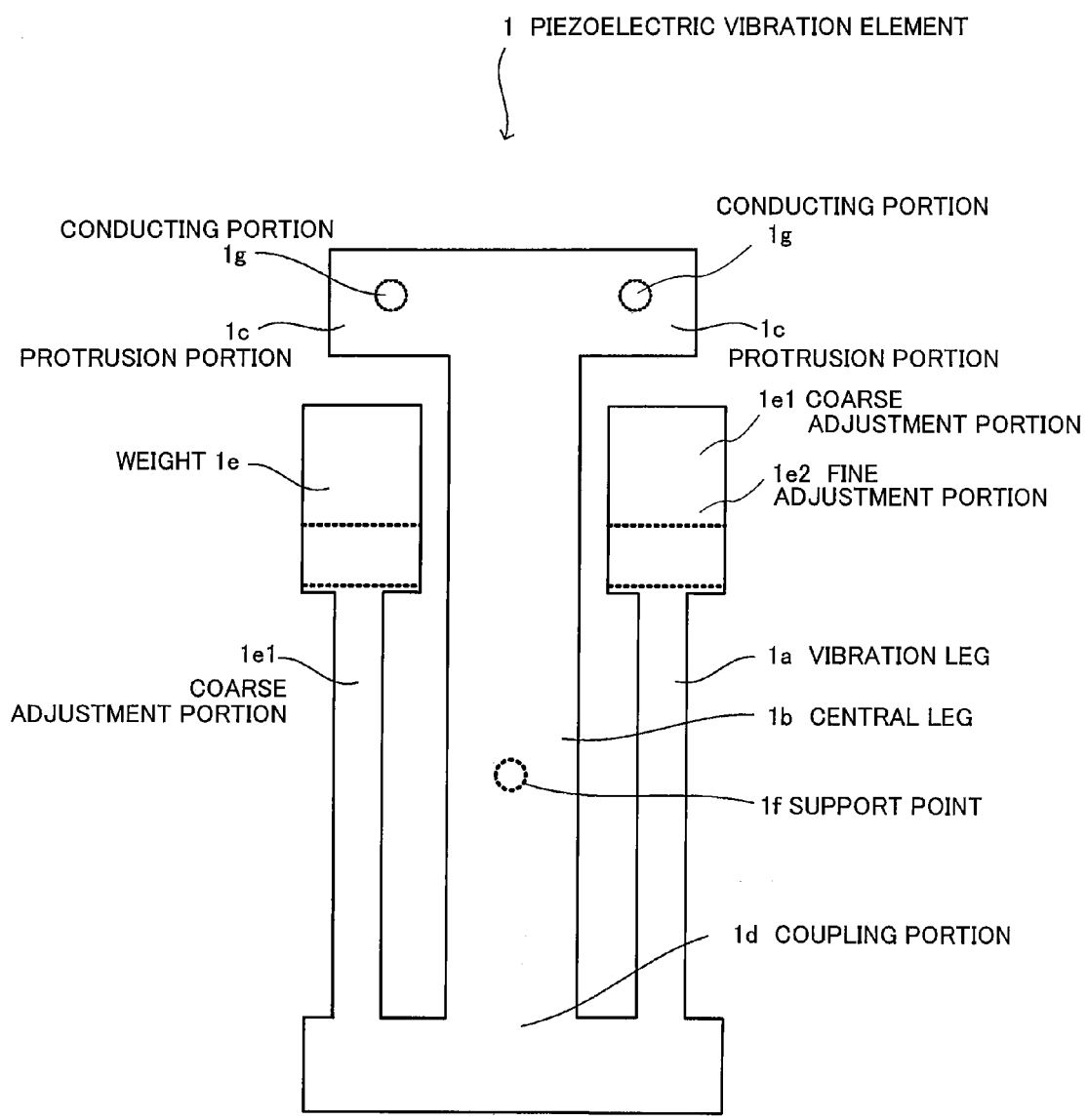
FIG. 1 is a diagram showing a piezoelectric vibration element of a piezoelectric device in one embodiment of the present invention.

1 Piezoelectric vibration element
1a Vibration leg
1b Central leg
1c Protrusion portion
1c1 Protrusion portion
1c2 Swollen portion
1d Coupling portion
1e Weight
1e1 Coarse adjustment portion
1e2 Fine adjustment portion
1f Support point
1g Conducting portion
1h Electrode
10 Piezoelectric device
11 Piezoelectric vibration element
11a Vibration leg
11b Central leg
11c Protrusion portion
12 Cavity
13 Package
14 Lid
15a,15b Fixing member
16 External connection electrode
17 Electrode
18 Mounting stand 19 Supporting portion
20 Piezoelectric device
21 Piezoelectric vibration element
21a Vibration leg
21b Central leg
21c Protrusion portion
22 Cavity
23 Package
24 Lid
25a,25b Fixing member
26 External connection electrode
28 Mounting portion
29 Supporting portion
31 feed-through electrode
37 Electrode
38 Mounting stand
41 Piezoelectric vibration element
43 Concave portion
44 Convex portion
45 Fixing member
48 Mounting portion
50 Piezoelectric device
51 Piezoelectric vibration element
52 Cavity
53 Package
54 Lid
55 Conductive adhesive
56 External connection electrode
57 Electrode
58 Mounting stand
61 Piezoelectric vibration element
61a Vibration leg
61b Central leg
62 Cavity
63 Package
64 Electrode
65 Conductive adhesive
66 Conductive pad
A-E Support position
α Range
β Range
γ Range

BEST MODE FOR CARRYING OUT THE
INVENTION

Embodiments of the present invention will be described below with reference to the drawings.
[Example of Configuration of Piezoelectric Vibration Element]
FIG. 1 is a plan view showing a piezoelectric vibration element provided in a piezoelectric device in this embodiment. Referring to FIG. 1, a piezoelectric vibration element 1 has three legs, that is, two vibration legs 1a arranged in parallel to each other and a central leg 1b arranged between, and in parallel to, the two vibration legs 1a. These three legs have one of their ends coupled together by a coupling portion 1d to form into one unit.

A weight 1e for adjusting the frequency is formed on the other end of the vibration leg 1a. This weight 1e may be formed, for example, by extending the width of the vibration leg 1a. This weight is provided to prevent an increase in the vibration frequency that is generated by the reduction in the size of the piezoelectric vibration element 1 and thereby to decrease the frequency to a predetermined frequency. The resonance frequency f of the piezoelectric vibration element of the tuning fork type, expressed by $f \propto W/L^2$ where W is the width of the vibration leg and L is the length of the vibration leg, is increased when the vertical size and the horizontal size of the piezoelectric vibration element 1 are reduced by the same ratio. In this configuration, adding the weight at the tip of the vibration leg reduces the resonance frequency.

The frequency of this weight 1e may be adjusted by two adjustment portions, coarse adjustment portion 1e1 and fine adjustment portion 1e2. The mass of the coarse adjustment portion 1e1 may be adjusted by removing silver from the coarse adjustment portion 1e1 by focusing a laser beam thereon. The mass of the fine adjustment portion 1e1 may be adjusted by spattering the surface.

On the central leg 1b, one support point 1f for supporting the package is provided. The position of this support point 1f is set within the range in which the temperature characteristics of the piezoelectric vibration element 1 on the central leg 1b are stable. The position of the support point 1f, which is set within the range for stabilizing the temperature characteristics of this piezoelectric vibration element, will be described later.

The piezoelectric vibration element 1 has protrusion portions 1c, each of which protrudes into the direction different from the length direction of the central leg, on the other end of the central leg 1b. This protrusion 1c has a conducting portion 1g provided thereon to electrically connect the piezoelectric vibration element 1 and an external unit.
[Embodiments of Piezoelectric Device]
Next, the following describes embodiments of the piezoelectric device with reference to FIG. 2 to FIG. 4.

Figure 2A:
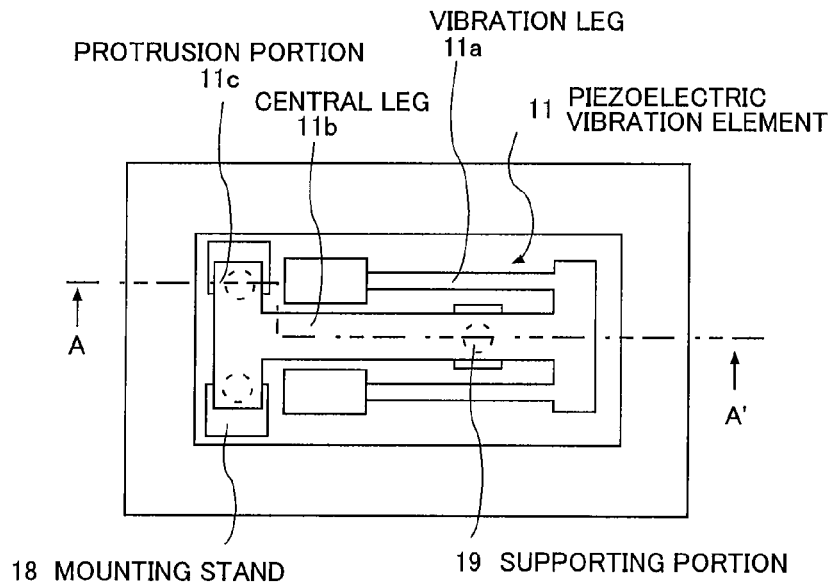
FIG. 2 is a diagram showing the piezoelectric device in one embodiment of the present invention.
Figure 2B:
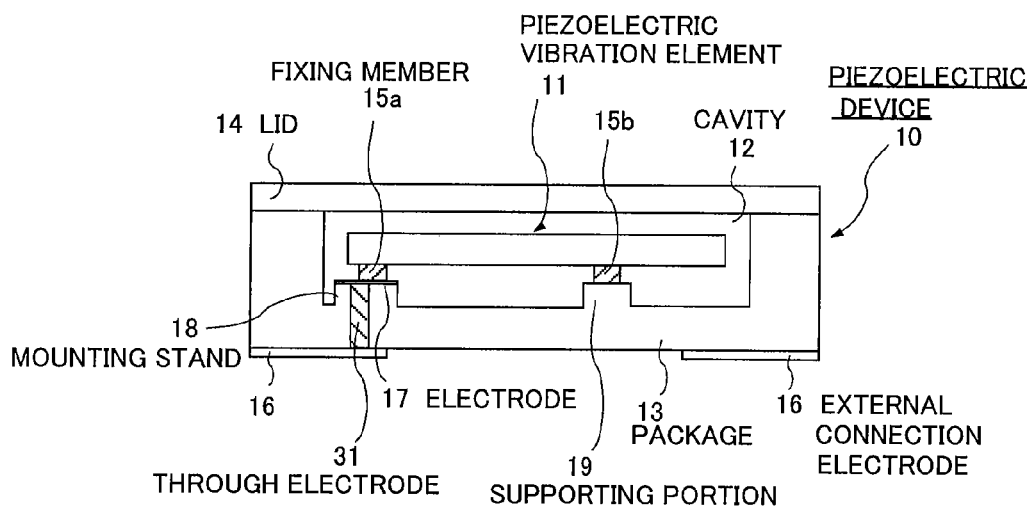

FIG. 2 is a diagram showing the piezoelectric device in this embodiment, FIG. 2A is a plan view showing the piezoelectric device in this embodiment viewed from the top, and FIG. 2B is a cross section diagram of the piezoelectric device in this embodiment taken along the line A-A' in FIG. 2A. Note that FIG. 2A shows the state in which the lid shown in FIG. 2B is removed.

As shown in FIGS. 2(a) and 2(b), a piezoelectric device 10 in this embodiment comprises a tuning-fork-type piezoelectric vibration element 11 comprising vibration legs 11a, a central leg 11b, and protrusion portions 11c; a package 13 that has a cavity 12, in which the piezoelectric vibration element 11 is stored, and an external connection electrode 16 provided on the surface opposed to the cavity 12; and a lid 14 for sealing the package 13.

Projections are formed in the package 13, one for a mounting stand 18 that is a stand for mounting the piezoelectric vibration element 11 and the other for a supporting portion 19 that supports and fixes the piezoelectric vibration element 11. The mounting stand 18 and the supporting portion 19 are formed integrally with the package 13. The piezoelectric vibration element 11 is supported and fixed on the mounting stand 18 and the supporting portion 19, formed integrally with the package 13, using elastic fixing members 15a and 15b such as silicon conducting adhesive.

The mounting stand 18 has an electrode 17 on the face (top surface), and this electrode 17 is electrically connected to the external connection electrode 16 via a feed-through electrode 31 that electrically connects the top face and the bottom face of the package 13. Therefore, this electrode 17 functions as a mounting portion for supporting and fixing the piezoelectric vibration element 11 in the package 13. The supporting portion 19 is electrically insulated from the external connection electrode to prevent external unwanted electrical signal from reaching the piezoelectric vibration element 11.

In the structure shown in FIG. 2, the central leg 11b of the piezoelectric vibration element 11 is supported and fixed on the supporting portion 19 using the fixing member 15b, and the protrusion portions 11c are supported and fixed on the electrodes 17, formed on the faces of two mounting stands 18 provided outside the width of the central leg 11b, using the fixing members 15a. In other words, the piezoelectric vibration element 11 is supported and fixed in the package 13 at three points, that is, two electrodes 17 acting as the mounting portions and the supporting portion 19, which are not in the same straight line. This structure allows the piezoelectric vibration element 11 to be installed in the package 13 in the statically stable state.

This structure allows the piezoelectric vibration element 11 to be stably installed in the package 13 and prevents the portion, which is not supported and fixed on the mounting stands 18 and is on the side opposed to the protrusion portions 11c of the piezoelectric vibration element 11, from coming into contact with the bottom face of the cavity 12 of the package 13. This structure also prevents the vibration legs 11a from coming into contact with the bottom face of the cavity 12 of the package 13 even when the piezoelectric vibration element 11 tilts with the central leg 11b of the piezoelectric vibration element 11 as the central axis, thus preventing deterioration in the characteristics of the piezoelectric device.

Figure 3A:
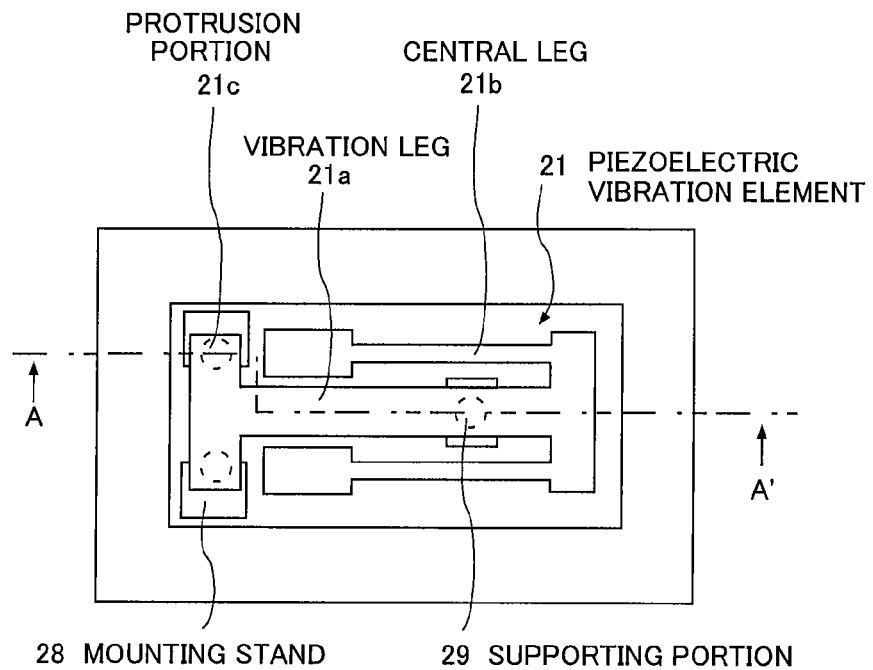
FIG. 3 is a diagram showing a piezoelectric device in another embodiment of the present invention.
Figure 3B:
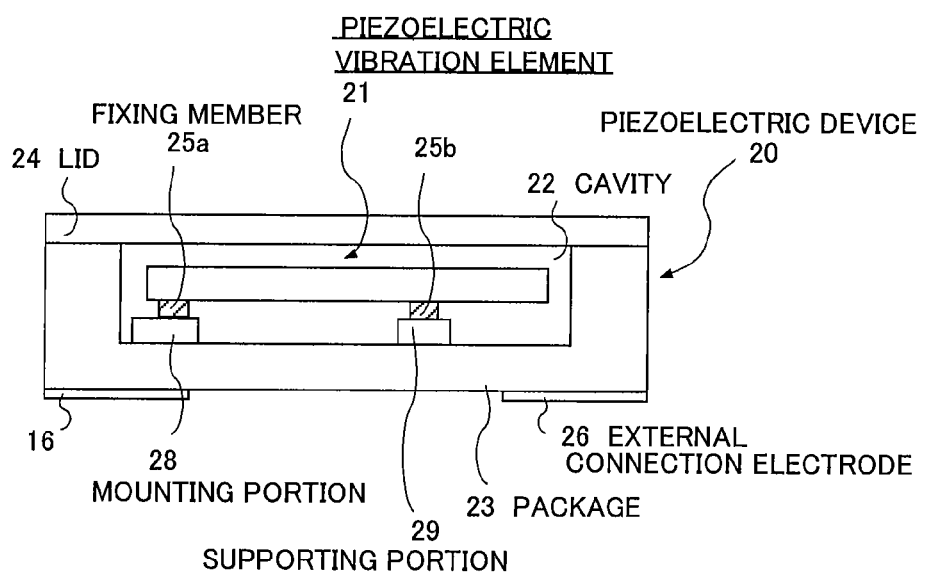

FIG. 3 is a diagram showing a second embodiment of the present invention, FIG. 3A is a plan view showing a piezoelectric device in the second embodiment viewed from the top, and FIG. 3B is a cross section diagram of the piezoelectric device in the second embodiment taken along the line A-A' in FIG. 3A. Note that FIG. 3A shows the state in which the lid shown in FIG. 3B is removed.

As shown in FIGS. 3(a) and 3(b), a piezoelectric device 20 in this embodiment comprises a tuning-fork-type piezoelectric vibration element 21 comprising vibration legs 21a, a central leg 21b, and protrusion portions 21c; a package 23 that has a cavity 22, in which the piezoelectric vibration element 21 is stored, and an external connection electrode 26 provided on the surface opposed to the cavity 22; and a lid 24 for sealing the package 23. The piezoelectric vibration element 21 is supported and fixed on mounting portions 28 and a supporting portion 29, which are formed on the bottom face of the cavity 22 of the package 23 by the deposition or plating technique, using fixing members 25a and 25b such as elastic silicon conductive adhesive.

In the second embodiment shown in FIG. 3, the mounting portion 28 is formed by a conductive material. This eliminates the need for the mounting stand 18, on which the electrode 17 is formed, in the first embodiment shown in FIG. 2, thus simplifying the manufacturing process. In the second embodiment, the mounting portion 28 is electrically connected to the external connection electrode 26 via a feedthrough electrode (not shown) that electrically connects the top face and the bottom face of the package 23. The supporting portion 29 is electrically insulated from the external connection electrode to prevent external unwanted electrical signals from reaching the piezoelectric vibration element 21.

Figure 4:
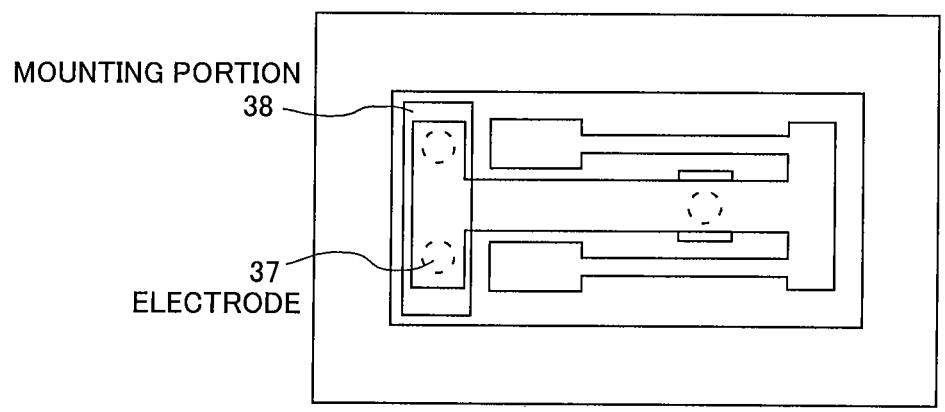
FIG. 4 is a diagram showing the piezoelectric device in another embodiment of the present invention.

Although one electrode 17, which functions as the mounting portion, is provided for each mounting stand 18 in FIG. 2, two electrodes 37 each supporting and fixing the piezoelectric vibration element may also be provided on one mounting stand 38 as shown in FIG. 4.

Although only the package 13 or 23 has a cavity 12 or 22 to provide space in which the piezoelectric vibration element 11 or 21 is stored as shown in FIG. 2 or 3, the lid or both the lid and the package may have a cavity to provide space in which the piezoelectric vibration element 11 or 21 is stored.

Although silicon conductive adhesive is used as the fixing member in the description of FIG. 2 and FIG. 3, the fixing member is not limited to this silicon conductive adhesive but a bump made of metal such as gold(Au), copper(Co), or aluminum(Al) may also be used. A bump made of metal, if used, reduces the possibility of degassing from the fixing member and thereby prevents the characteristics of the piezoelectric device from deteriorating from aging.

If used as the fixing member for the supporting portion, electrically-insulating adhesive more reliably insulates between the piezoelectric vibration element and the package and more reliably prevents an unwanted electrical signal from reaching the piezoelectric vibration element. In addition, the structure in which the surface of the supporting portion is covered with an insulating film achieves the same effect.

Figure 5A:
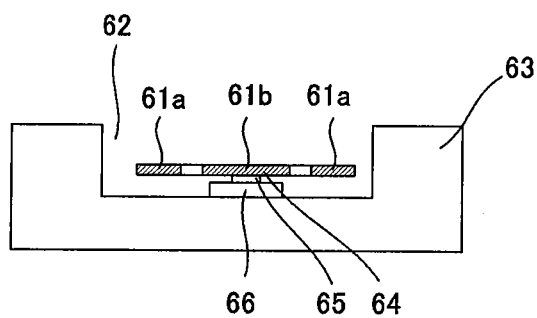
FIG. 5 is a diagram showing an example of the behavior in the embodiment of the present invention.
Figure 5B:
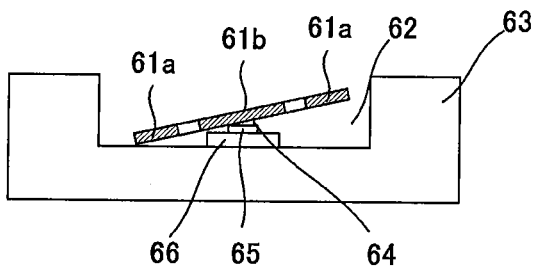
Figure 17A:
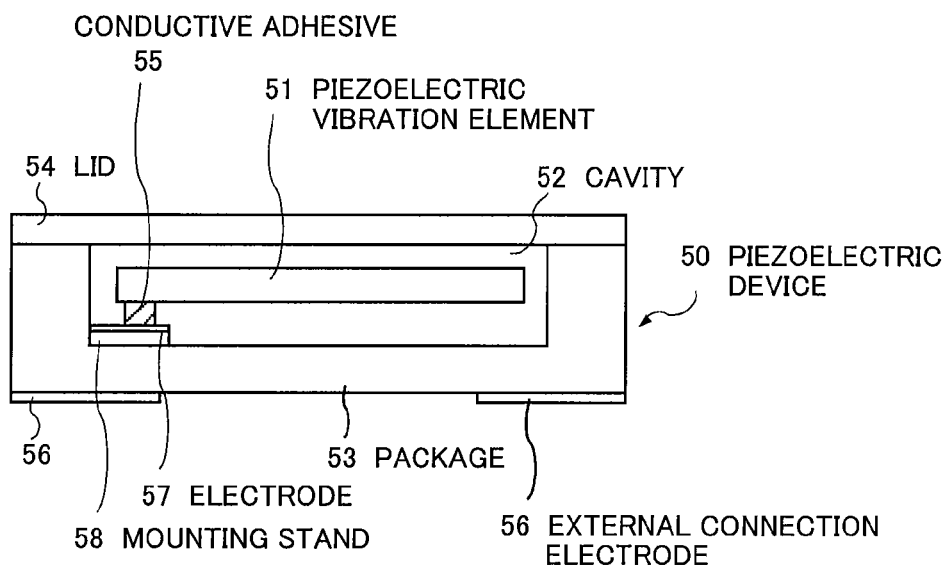
FIG. 17 is a diagram showing the piezoelectric device in the prior art.
Figure 17B:
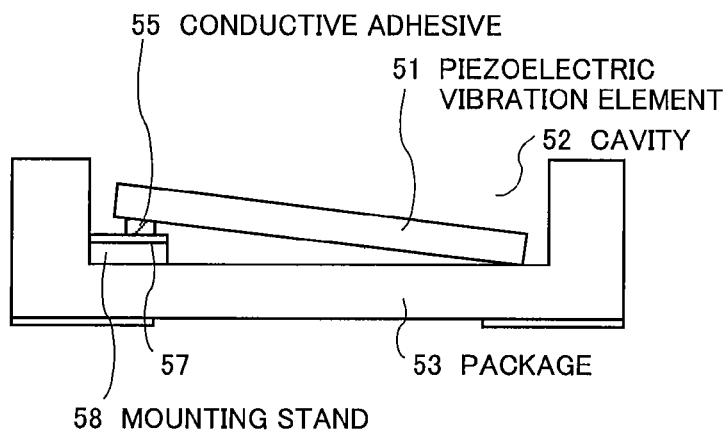
Figure 18:
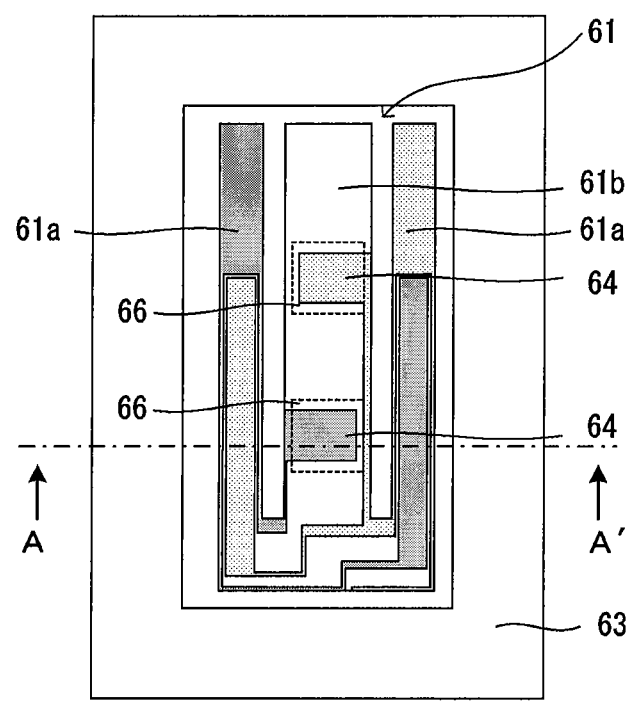
FIG. 18 is a diagram showing the piezoelectric device in the prior art.

The piezoelectric device of the present invention employs the structure, in which the central leg is supported in the package by one point on the central leg and by the protrusion portions, to support the piezoelectric vibration element more stably. FIG. 5A is a cross section diagram taken along the line A-A' in FIG. 17A. FIG. 5B is a cross section diagram showing the state in which the piezoelectric vibration element in FIG. 5A tilts.

When the central leg is supported only by one point as shown in the figure, the problem is that, when installed in a package 63, the piezoelectric vibration element 61 tilts with the central leg as the central axis as shown in FIG. 5B, with the result that the vibration legs 61a come into contact with the bottom face of the cavity 62 of the package 63 and the characteristics of the piezoelectric device are deteriorated.

In contrast, the piezoelectric device of the present invention is structured in such a way that the central leg is supported by one point on the central leg as well as by the protrusion portions to enable the piezoelectric vibration element to be supported more stably.

Although FIG. 2 to FIG. 4 show the case in which the piezoelectric vibration element is a tuning-fork type quartz crystal vibration element, the present invention is applicable also to a square AT-cut quartz crystal vibration element if the supporting portion is provided in the portion opposed to the side that is opposed to the mounting portion.

FIG. 6 is a diagram showing the cross section structure of the mounting portion in this embodiment of the present invention.

Figure 6A:
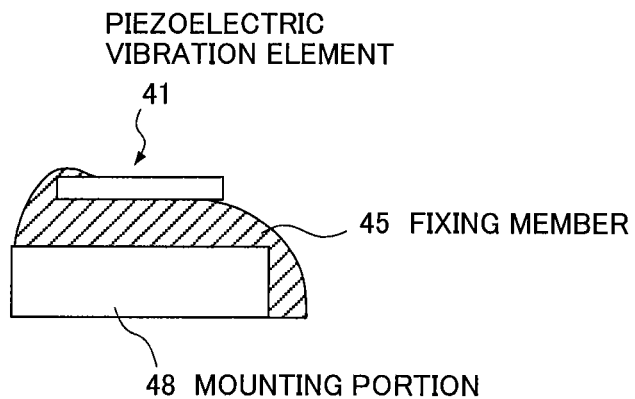
FIG. 6 is a diagram showing the cross section structure of the mounting portion in this embodiment of the present invention.
Figure 6B:
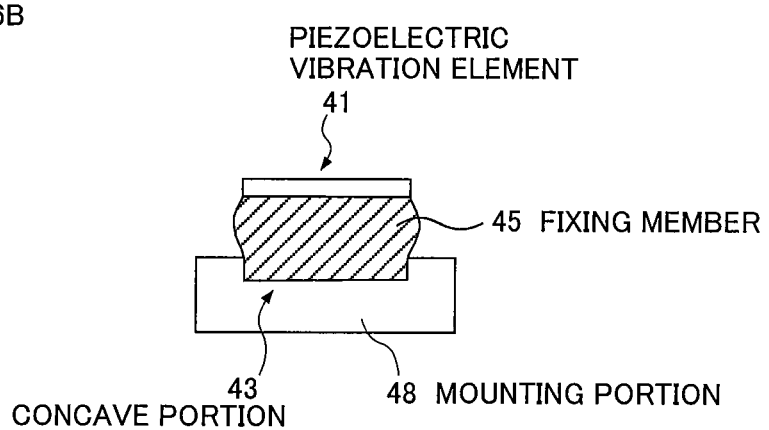
Figure 6C:
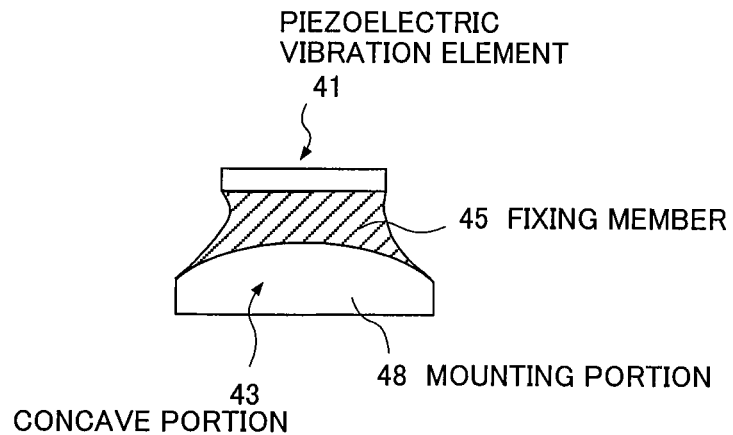

FIG. 6A shows the structure when the cross section of the upper portion of the a mounting portion 48 is flat, FIG. 6B shows the structure when the cross section of the upper portion of the mounting portion 48 is concave, and FIG. 6C shows the structure when the cross section of the upper portion of the mounting portion 48 is convex.

When the cross section of the upper portion of the mounting portion 48 is flat as shown in FIG. 6A, the fixing member 45, if excessive, may run on the top surface of a piezoelectric vibration element 41 or drop down from the mounting portion 48, sometimes leading to deterioration in the characteristics. In contrast, when the cross section of the upper portion of the mounting portion 48 is concave as indicated by a concave portion 43 shown in FIG. 6B, the fixing member 45, if excessive, collects in this concave portion 43 instead of running on the top surface of the piezoelectric vibration element 41 or dropping from the mounting portion 48. When the cross section of the upper portion of the mounting portion 48 is convex as indicated by a convex portion 44 shown in FIG. 6C, enough space is provided between the piezoelectric vibration element 41 and the mounting portion 48 and so the fixing member 45, if excessive, is held under surface tension in the space between the piezoelectric vibration element 41 and the mounting portion 48.

Although the mounting portion is shown in FIG. 6, the supporting portion shown in FIG. 2 to FIG. 4 may employ the structure similar to that shown in FIG. 6 to achieve the same effect.

Although the outer shape of the supporting portion is larger than the width of the central leg of the piezoelectric vibration element in FIG. 2 to FIG. 6, there is no problem if the outer shape of the supporting portion is equal to or smaller than the width of the central leg of the piezoelectric vibration element.

In fabricating a package used for the piezoelectric device of the present invention, a semiconductor substrate, such as a silicon(Si) wafer, may be used as the basic material of the package. Using a semiconductor substrate makes it possible to use the semiconductor photo-lithography process, to perform collective processing on a wafer basis, to form a mounting stand and a supporting portion in a package easily, and to reduce the fabrication cost.

[Impact resistance of piezoelectric device]

Next, with reference to FIGS. 7 and 8, the following describes an improvement in the impact resistance achieved by the configuration of the piezoelectric device of the present invention.

FIG. 7 and FIG. 8 show the examples of the result of the impact resistance test performed for the piezoelectric device of the present invention for comparing between the three-point support and the two-point support in terms of the frequency variation and the CI value variation.

Figure 7A:
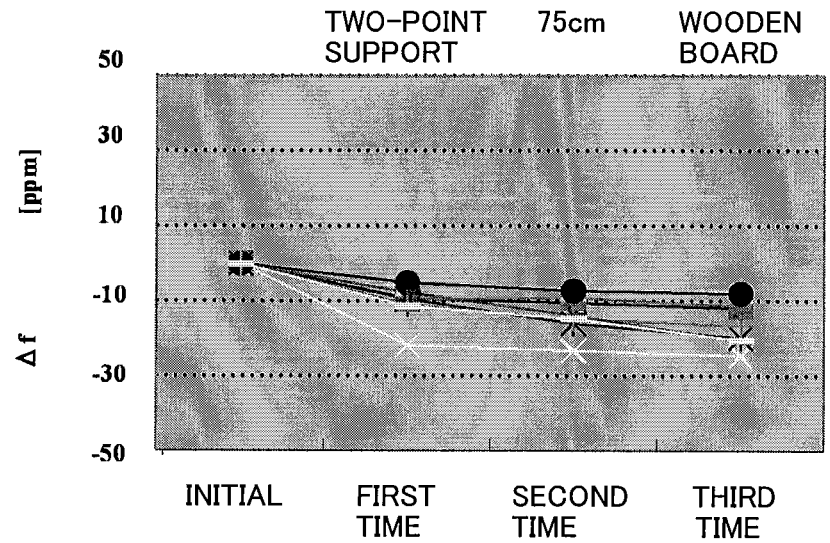
FIG. 7 is a diagram showing an improvement in the impact resistance in the configuration of the piezoelectric device of the present invention.
Figure 7B:
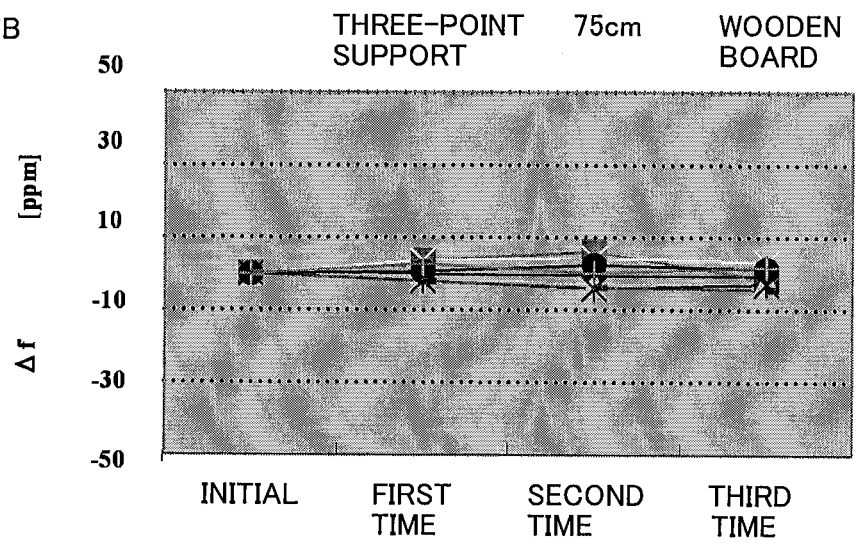
Figure 8A:
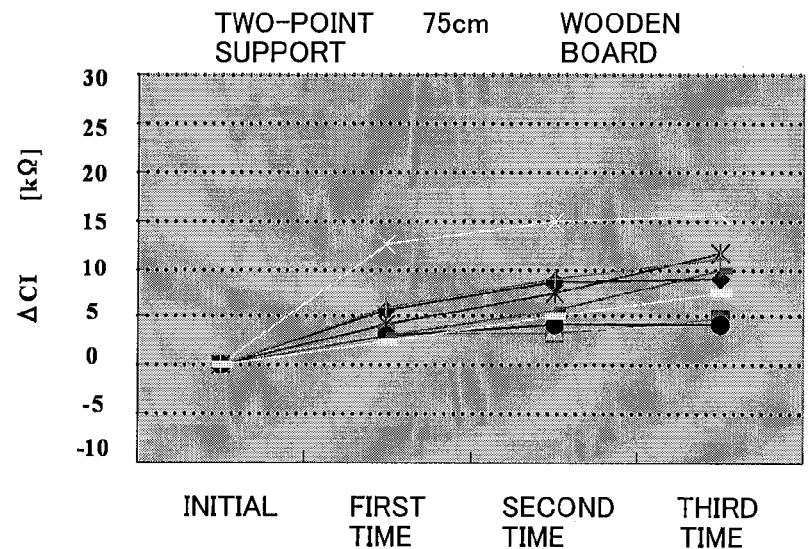
FIG. 8 is a diagram showing an improvement in the impact resistance in the configuration of the piezoelectric device of the present invention.
Figure 8B:
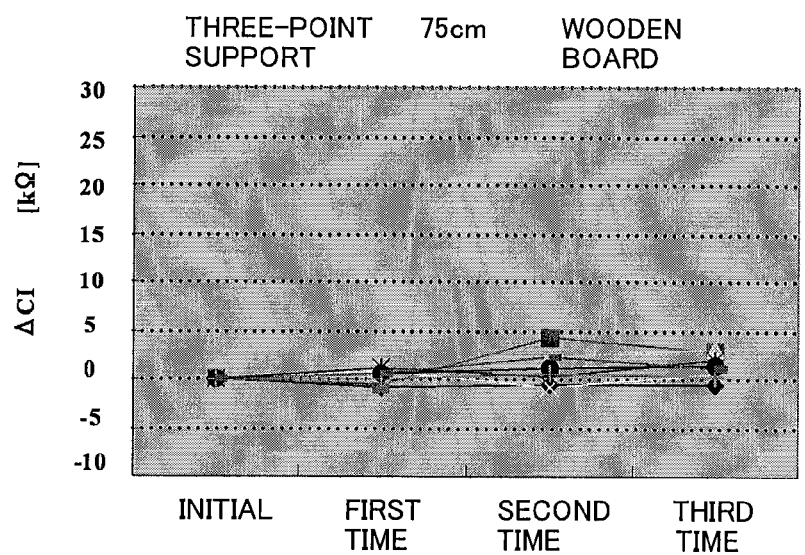

In this test examples, the free-fall drop test is made by dropping the piezoelectric device three times from the height of 75 cm onto a hard wooden board to compare between the two-point support and the three-point support in terms of the frequency variation Δf (shown in FIG. 7) and the CI value variation (shown in FIG. 8). FIG. 7A and FIG. 8A show the result of the test for the two-point support configuration, and FIG. 7B and FIG. 8B show the result of the test for the three-point support configuration.

All test results show that the frequency variation width and the CI value variation width of the three-point support configuration are smaller than those of the two-point support configuration, indicating that the impact resistance has improved.

[Temperature Characteristics of Piezoelectric Device]

Next, the following describes the temperature characteristics of the piezoelectric device of the present invention with reference to FIG. 9 to FIG. 13. The piezoelectric vibration element of the piezoelectric device of the present invention sets the position of the support point on the central leg within the range where the temperature characteristics are stable, thereby suppressing a decrease in the temperature characteristics of the piezoelectric device such as the frequency characteristics and the CI characteristics.

Figure 9:
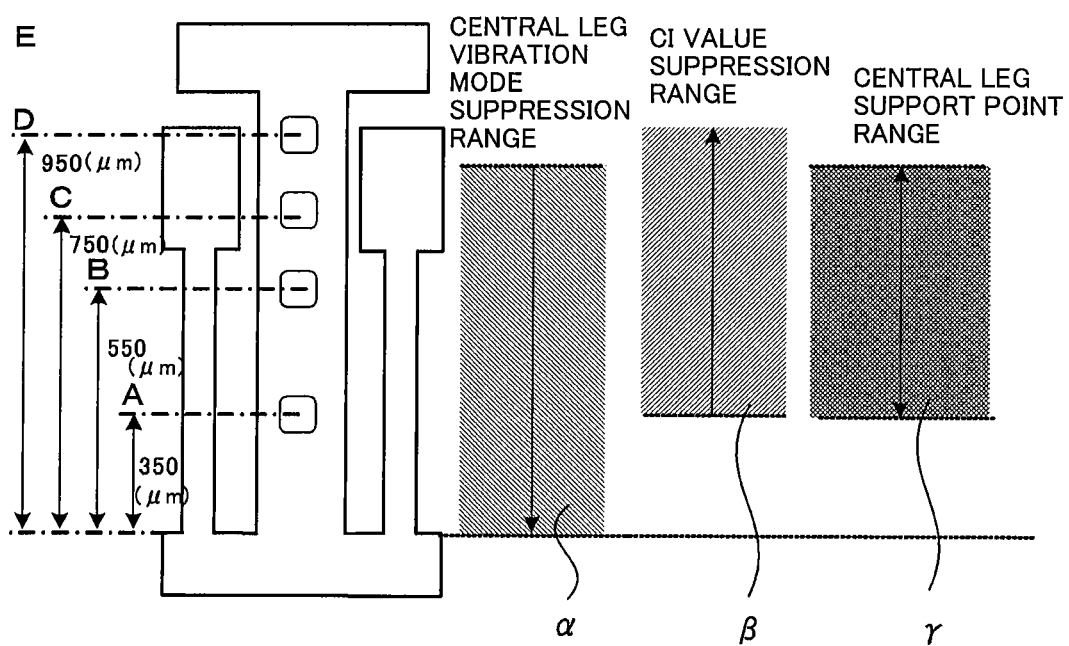
FIG. 9 is a diagram showing a range in which the temperature characteristics are stable for a support point on the central leg in the piezoelectric device of the present invention.

FIG. 9 is a diagram showing the range in which the temperature characteristics become stable in relation to the position of the support point on the central leg.

Based on the knowledge that the frequency characteristics and the CI value characteristics, which are the temperature characteristics of a piezoelectric device, depend on the position of the support point on the central leg, the present invention sets the position of the support point on the central leg within a predetermined range to stabilize the temperature characteristics such as the frequency characteristics and the CI value characteristics.

More specifically, one of the factors in deteriorating the temperature characteristics of a piezoelectric device is a frequency variation caused by the temperature in the central leg vibration mode. Based on the fact that this frequency variation depends on the position of the support point on the central leg and that the CI value variation depends also on the position of the support point on the central leg, the support point is set within the range of the positions of the support point on the central leg where the stable temperature characteristics can be obtained.

A frequency variation in the central leg vibration mode becomes a factor that actually causes a vibration in the central leg vibration mode. This central leg vibration mode, which is induced by the coupling between the resonance frequency of the central leg and the basic frequency of the piezoelectric vibration element, is the state in which the actual vibration is generated. The resonance frequency of the central leg is characterized in that, as the temperature rises, the resonance frequency is decreased and becomes closer to the basic frequency of the piezoelectric vibration element. As the vibration frequency of the central leg becomes closer to the basic frequency of the piezoelectric vibration element, the vibration induced through the coupling prevents the piezoelectric vibration element from oscillating stably, causing a variation in the vibration frequency.

In the piezoelectric vibration element of the present invention, the variation characteristics of the vibration frequency depend on the distance between the coupling portion, which couples the central leg and the vibration legs, and the support point on the central leg. And, based on the fact that the generation of the central leg vibration mode is suppressed as the support point gets nearer to the coupling portion, the support point is set at a position in the range of a predetermined distance from the coupling portion to suppress the generation of the central leg vibration mode and thereby to provide the stable temperature characteristics.

In addition, in the piezoelectric vibration element of the present invention, the increase in the CI value affected by the central leg support depends on the distance between the coupling portion, which couples the central leg and the vibration legs, and support point on the central leg. And, based on the fact that the increase in the CI value is suppressed as the support point gets away from the coupling portion, the support point is set at a position outside the range of a predetermined distance from the coupling portion to suppress the increase in the CI value and thereby to provide the stable CI value characteristics.

In FIG. 9, the range α indicates the range in which the generation of the central leg vibration mode is suppressed, the range β indicates the range in which the increase in the CI value affected by the central leg support is suppressed, and the range γ indicates the range common to the two ranges, range α and range β.

By setting the support point within the range α, the position of the support point on the central leg from the coupling portion becomes a position nearer to the coupling portion in such a way the distance is smaller than the distance which would induce the vibration resonance between the vibration legs and the central leg when the vibration frequency of the central leg becomes closest to the basic vibration frequency of the vibration legs within the allowable temperature range in terms of the variation characteristics of the vibration frequency of the central leg for the temperature. By determining this position as the range in which the temperature characteristics are stable, the generation of the central leg vibration mode can be suppressed and the decrease in the temperature characteristics, such as the frequency characteristics and the CI characteristics, can be suppressed.

By setting the support point within the range β, the position of the support point on the central leg becomes a position where the distance between the support point on the central leg and the coupling portion is large enough to ignore an increase in the CI value for the support position on the central leg and, therefore, the deterioration in the CI value caused by the support of the central leg can be suppressed.

The range γ that includes both range α and range β is a range in which both the generation of the central leg vibration mode and the increase in the CI value are suppressed.

Figure 10A:
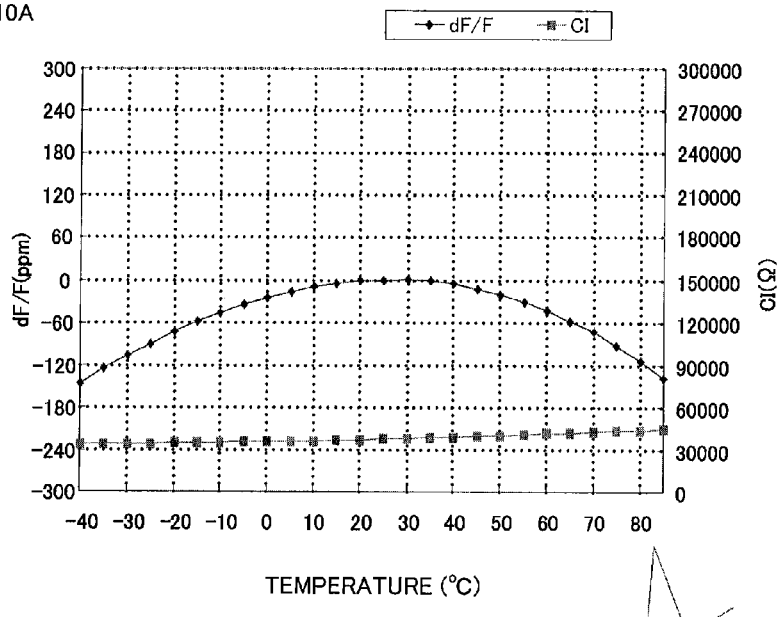
FIG. 10 is a diagram showing an example of the temperature characteristics of the piezoelectric vibration element of the present invention.
Figure 10B:
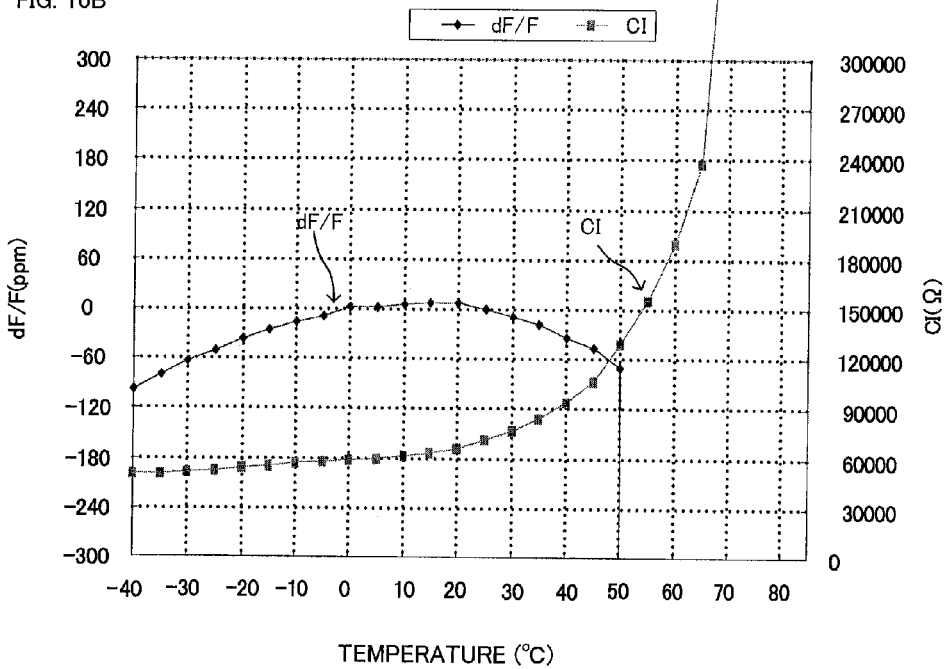

FIG. 10 is a diagram showing an example of the temperature characteristics of the piezoelectric vibration element of the present invention. The frequency characteristics and the CI value temperature characteristics shown in FIG. 10B indicate that the frequency indicated by the frequency characteristics (df/f) becomes unstable around 50° C. and an oscillation failure occurs and that the CI value increases rapidly around 20° C. In general, a piezoelectric device has the problem that the temperature characteristics, which mean the dynamic stability when the vibration element vibrates, are deteriorated as the piezoelectric device becomes smaller, for example, the frequency characteristics vary or the CI value increases as the temperature changes.

For the piezoelectric vibration element of a piezoelectric device, it is desirable that, when the temperature changes, the frequency variation be small and the increase in the CI value be small, and it is required that deterioration in the temperature characteristics of the piezoelectric device, such as the frequency characteristics and CI characteristics involved in making the piezoelectric device small, be suppressed.

To meet those needs, the position of the support point on the central leg from the coupling portion is set in the range γ according to the piezoelectric device of the present invention to stabilize both the frequency characteristics and the CI value characteristics as shown in FIG. 10A.

FIGS. 11 and 12 are diagrams showing the basic frequency of the piezoelectric vibration element and the frequency of the central leg vibration mode when the temperature changes.

Figure 11A:
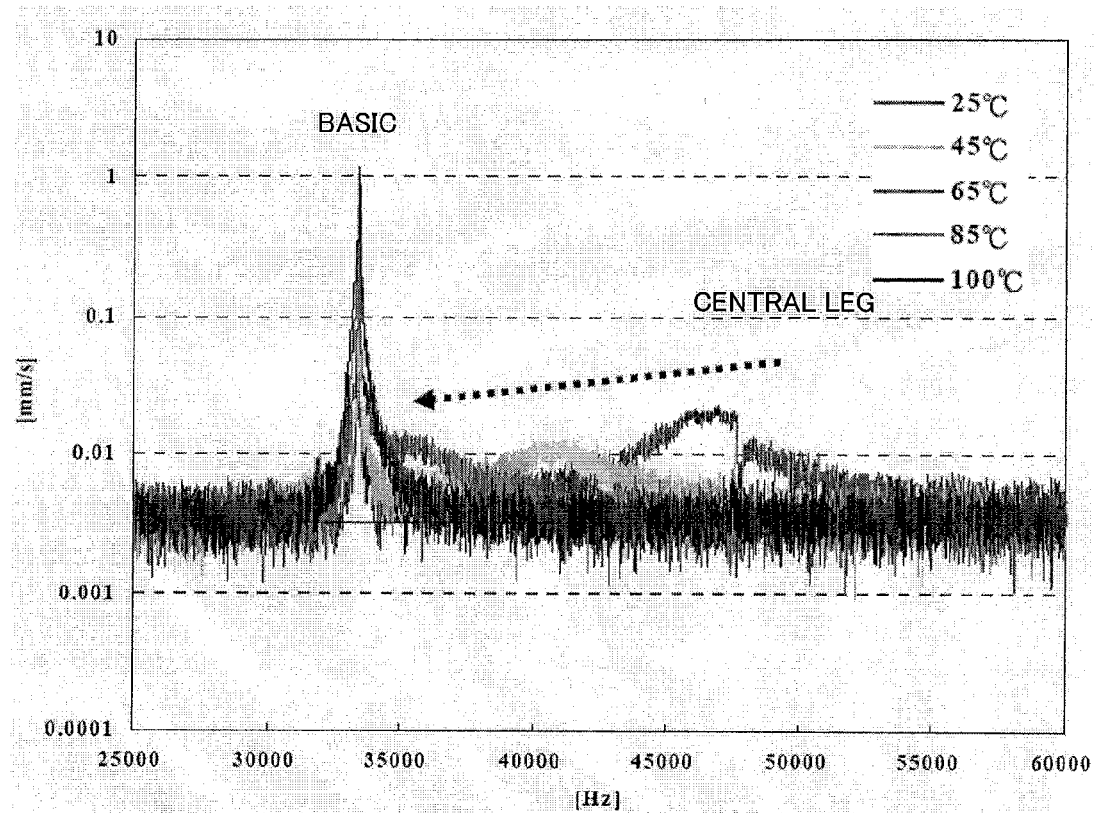
FIG. 11 is a diagram showing the basic frequency of the piezoelectric vibration element and the frequency of the central leg vibration mode when the temperature changes.
Figure 11B:
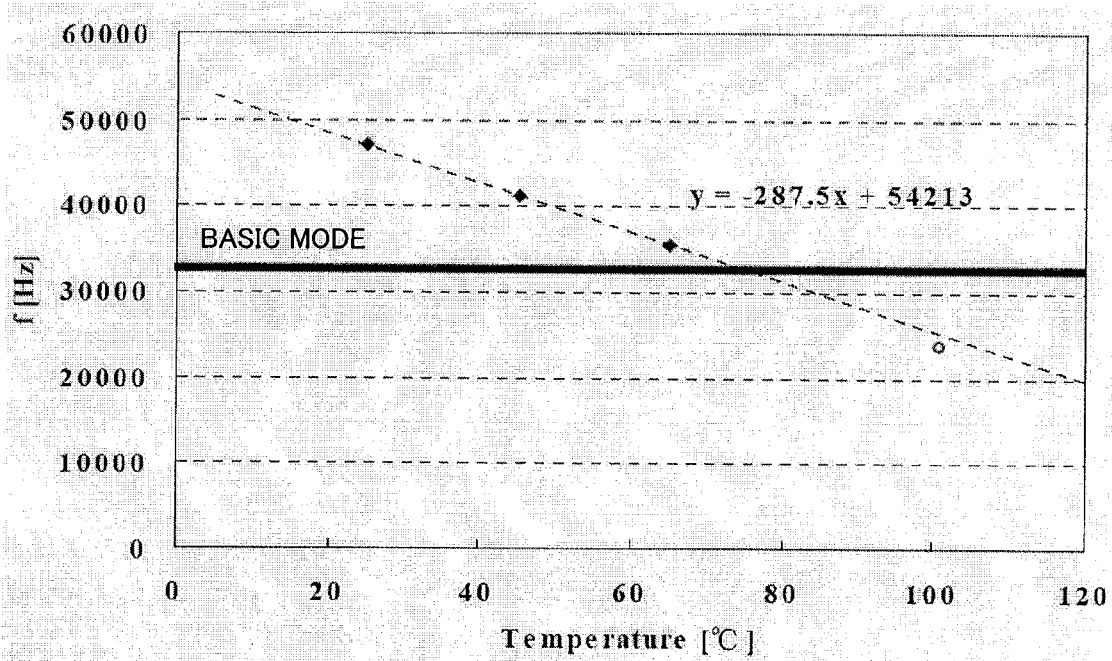

As shown in FIGS. 11(a) and 11(b), the resonance frequency of the central leg vibration mode has the characteristics that the resonance frequency becomes closer to the basic frequency of the piezoelectric vibration element as the temperature rises. FIG. 11B shows the temperature characteristics of the central leg vibration mode and the temperature characteristics of the basic frequency. Note that the vibration frequency of the central leg (indicated by the broken line in FIG. 11B), which tends to decrease as the temperature rises, approaches and finally crosses the basic frequency.

When the resonance vibration frequency of the central leg vibration mode becomes closer to the basic frequency, coupling occurs and this coupling induces vibration in the central leg vibration mode. In this central leg vibration mode, the central leg also vibrates and enters the unstable state, thus preventing the piezoelectric vibration element from oscillating stably. Note that, when the resonance vibration frequency is not close to the basic frequency, the central leg does not practically vibrate.

Figure 12A:
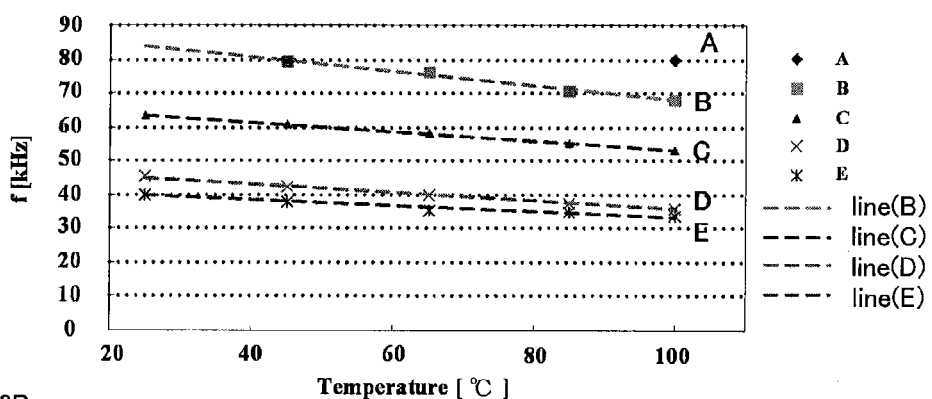
FIG. 12 is a diagram showing the frequency of the piezoelectric vibration element in the central leg vibration mode when the temperature changes.

FIG. 12 is a diagram showing how the vibration frequency of the central leg depends on the position of the support point. In FIG. 12A, the support positions A-E indicate the corresponding positions of the support points shown in FIG. 9, and the support position A to the support position D indicate the positions in order of the distance from the coupling portion with the support position A nearest to the coupling portion. The support position E indicates the case in which there is no support point on the central leg.

As shown in FIG. 12A, the temperature characteristics of the frequency of the central leg vibration mode at each support point are linear characteristics that decrease as the temperature rises. And, as the position of the support point is more away from the coupling portion, the frequency becomes lower and becomes closer to the basic frequency while, as the position of the support point is nearer to the coupling portion, the frequency becomes higher and the difference from the basic frequency becomes larger. This indicates that the vibration of the central leg vibration mode is more likely to be induced at the support position D and the support position E and that the vibration of the central leg vibration mode is less likely to be induced at the support positions A, B, and C.

Figure 12B:
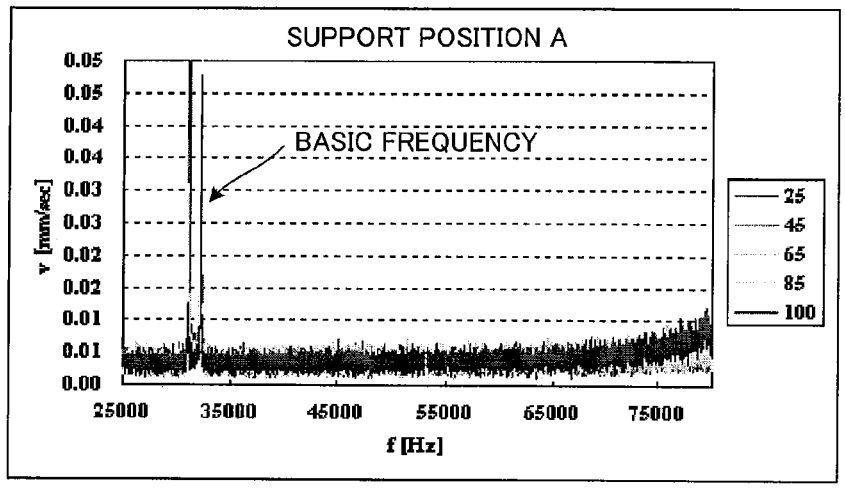
Figure 12C:
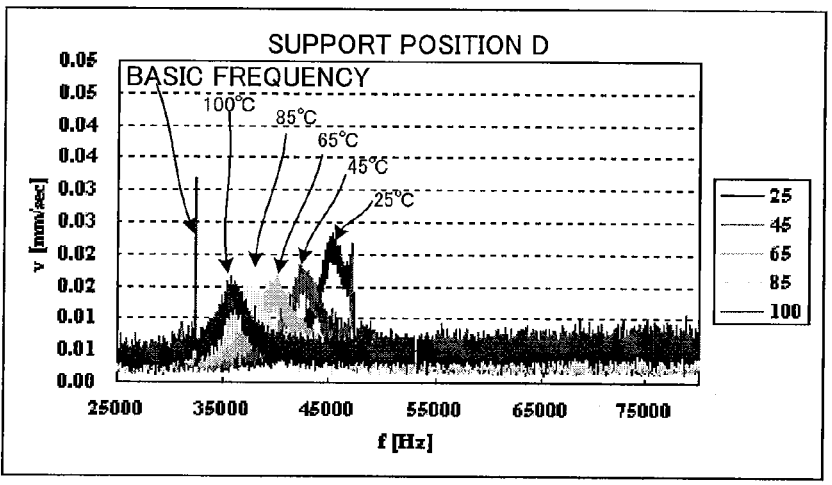

FIG. 12B shows the vibration frequency at the support point A for various temperatures, and FIG. 12C shows the vibration frequency at the support point D for various temperatures. The temperature characteristics at the support position D in FIG. 12C indicate that the vibration frequency of the central leg becomes closer to the basic frequency as the temperature rises. On the other hand, the temperature characteristics at the support position A in FIG. 12B indicate that the change in the vibration frequency of the central leg is small even when the temperature rises, meaning that the vibration frequency does not become closer to the basic frequency.

Therefore, by making the distance from the support point to the coupling portion shorter than the distance, which would induce the vibration resonance between the vibration legs and the central leg, in such a way that the support point is set nearer to the coupling portion, the generation of the central leg vibration mode is suppressed and the stable temperature characteristics are obtained.

In addition, by making the distance shorter than the distance, which would induce the vibration resonance between the vibration legs and the central leg, in such a way that the support point is set nearer to the coupling portion when the vibration frequency of the central leg is closest to the basic vibration frequency of the vibration legs in the allowable temperature range of the piezoelectric device, the generation of the central leg vibration mode is suppressed and the stable temperature characteristics are obtained.

Figure 13:
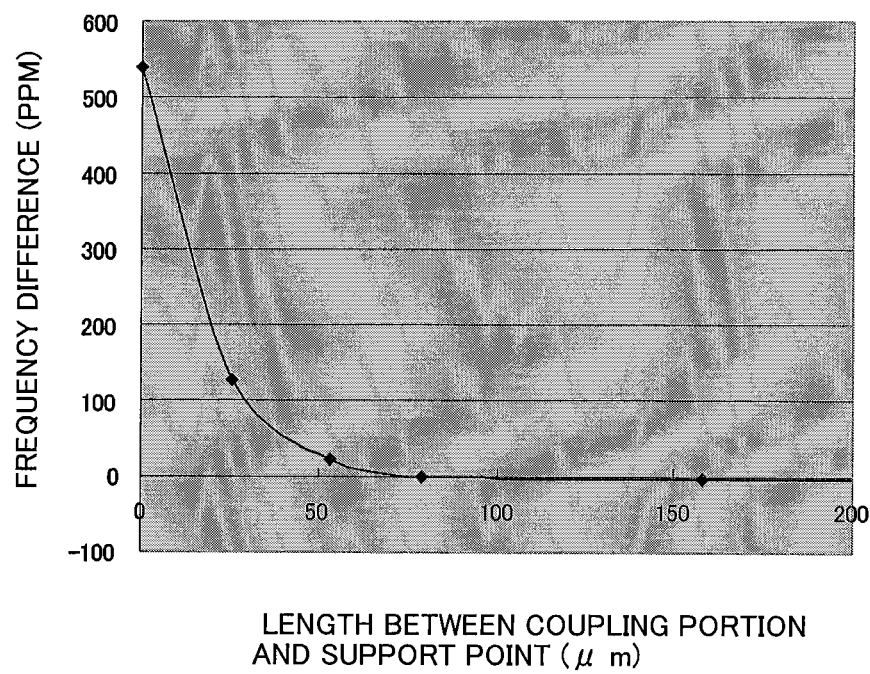
FIG. 13 is a diagram showing the effect of the central leg support on the piezoelectric vibration element.

FIG. 13 is a diagram showing the effect of the central leg support on the operation of the piezoelectric vibration element. In FIG. 13, the horizontal axis indicates the distance (μm) between the coupling portion and the supporting portion on the central leg, and the vertical axis indicates the frequency difference (ppm) between when the support is provided and when the support is not provided.

The frequency difference (ppm), which indirectly represents a power loss at the supporting portion, becomes larger as the power loss at the supporting portion becomes larger. The larger the vibration loss is, the worse the CI value becomes. Therefore, the frequency difference (ppm) is a value that may be used as the index of the CI value (equivalent resistance value) of the piezoelectric vibration element. This means that keeping the frequency difference (ppm) smaller enough could prevent the CI value from being increased due to the effect of the support on the central leg.

This indicates that the position of the support point on the central leg from the coupling portion, when set at a position where the frequency difference (ppm) is small enough and the increase in the CI value is fully ignored, would lead to a decrease in the loss in the supporting portion and suppress an increase in the CI value.

[Example of Configuration of Piezoelectric Vibration Element]

Figure 14:
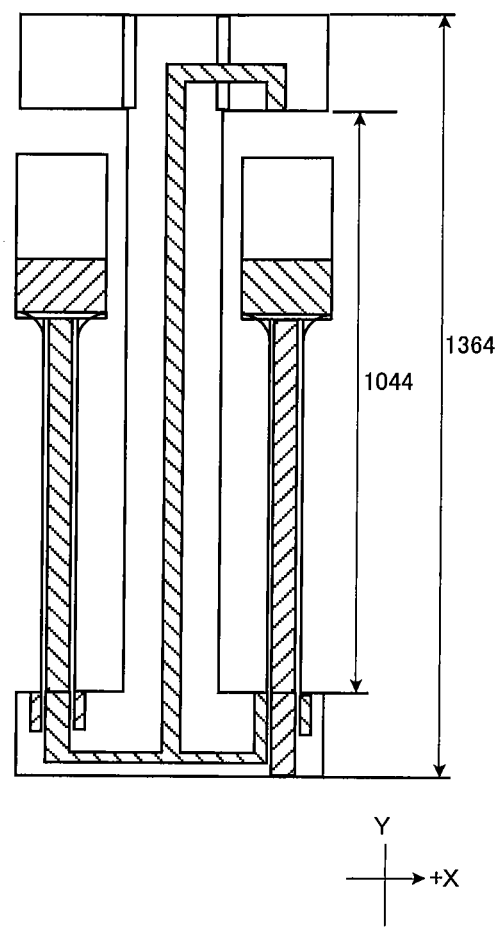
FIG. 14 is a diagram showing an example of the configuration of the piezoelectric vibration element of the present invention.
Figure 15:
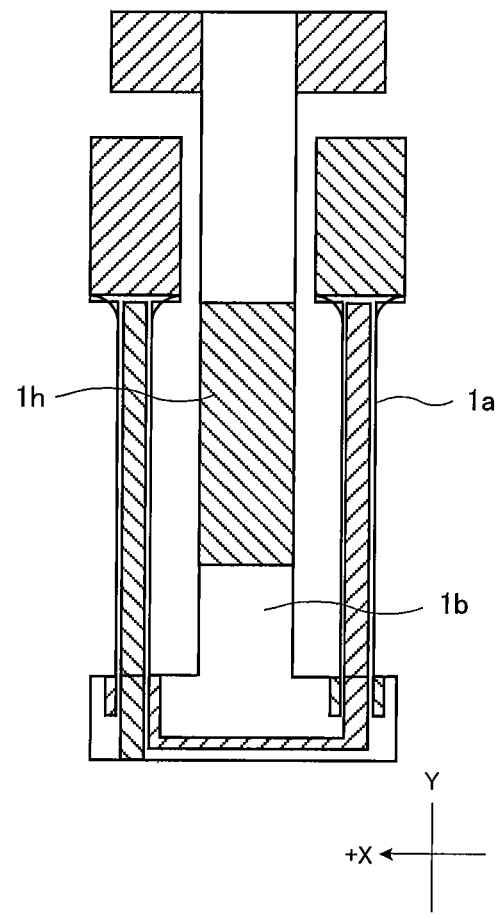
FIG. 15 is a diagram showing an example of the configuration of the piezoelectric vibration element of the present invention.

Next, with reference to FIG. 14 and FIG. 15, the following describes an example of the configuration of the piezoelectric vibration element of the present invention. In the description below, examples of the electrode arrangement and the sizes are shown.

FIG. 14 is a diagram showing an example of the front side of the piezoelectric vibration element, and FIG. 15 shows an example of the back side of the piezoelectric vibration element, with the shaded areas indicating the electrode provided on the surface. The numeric values in FIGS. 14 and 15 indicate the sizes, in μm, of the parts of the piezoelectric vibration element.

The approximate sizes of the piezoelectric vibration element are that the total length is 1364 μm and the leg length of the central leg is 1044 μm. On the vibration legs, the grooves are provided along the length direction.

Referring to FIG. 15, an electrode 1h is formed on the central leg 1b of the piezoelectric vibration element. This electrode 1h is formed on the side that faces the cavity side when the piezoelectric vibration element is supported and fixed. As described above, this electrode 1h is formed in the range, beginning at a position determined in the range on the central leg where temperature characteristics are stable, considering the extension of the conductive adhesive. For example, the electrode 1h is formed in the range of 300 μm square.

This electrode 1h is an electrode not for taking out the detection signal of the vibration element but for increasing electrical stability. On the side (not shown in FIG. 15) of the central leg 1b, the wiring for taking out the detection signal is formed along the length direction of the central leg 1b.

The central leg 1b is supported and fixed by conductive adhesive in the same manner as the conducting portion 1g. When the central leg 1b, on which such wiring is formed, is supported and fixed on the cavity side using conductive adhesive, the conductive adhesive, which is fluid, sometimes flows into, and comes into contact with, the wiring. The electrical characteristics vary due to the stray capacitance between the conductive adhesive and the wiring depending upon whether the conductive adhesive comes into contact with the wiring or not.

To solve this problem, an electrode having an area sufficiently larger than the adhesion area of the conductive adhesive is formed on the central leg 1b of the piezoelectric device of the present invention to fix the central leg 1b with the conductive adhesive in contact with this electrode. This structure reduces a variation in the stray capacitance and thereby stabilizes the oscillation frequency of the vibrator.

Fixing the central leg 1b with the use of insulating adhesive prevents the problem of the stray capacitance described above from being generated, while conductive adhesive, if used as in fixing the conducting portion 1g, simplifies the gluing process. If conductive adhesive is used for gluing the conducting portion 1g and if insulating adhesive is used for gluing the central leg 1b, the number of processes is increased because the two gluing processes are necessary.

The sizes of the piezoelectric vibration element of the piezoelectric device of the present invention are not limited to those shown in FIGS. 14 and 15. Nor is the shape of the tip of the central leg limited to the one shown in FIG. 1.

[Example of Modification of Piezoelectric Vibration Element]

Next, the following describes examples of the modification of the piezoelectric vibration element according to the present invention with reference to FIG. 16.

Figure 16A:
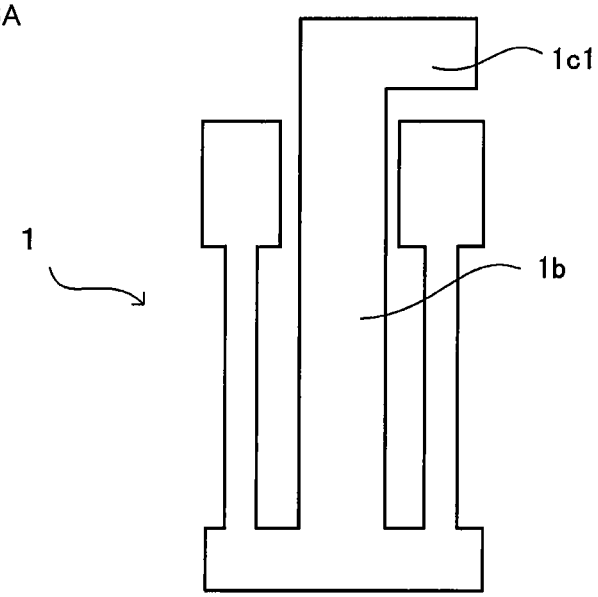
FIG. 16 is a diagram showing a modification of the piezoelectric vibration element of the present invention.

FIG. 16A is a diagram showing an example of the modification of the piezoelectric vibration element in which the protrusion portion 1c at the tip of the central leg 1b is formed by a protrusion portion 1c1 provided only one side of the central leg 1b.

Figure 16B:
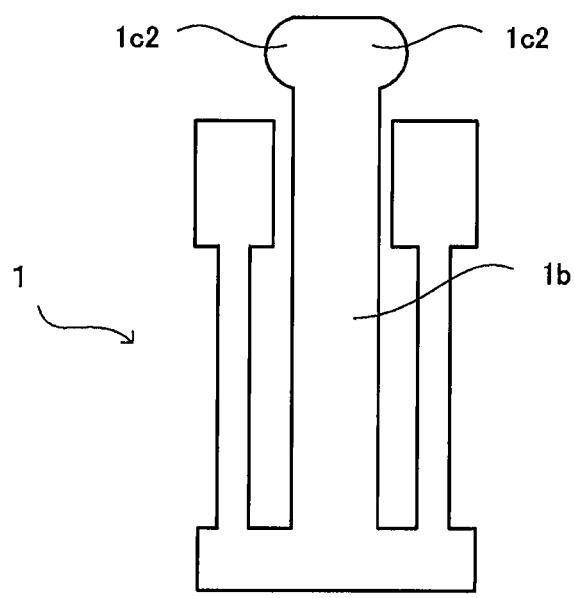

FIG. 16B is a diagram showing another example of the modification of the piezoelectric vibration element in which the protrusion portion 1c at the tip of the central leg 1b is formed by a swollen portion 1c2 swollen on both sides of the tip of the central leg 1b.

The invention claimed is:

1. A piezoelectric device in which a piezoelectric vibration element is mounted in a package wherein
said piezoelectric vibration element comprises:
two stick-like vibration legs;
a central leg provided between said two vibration legs;
a coupling portion that couples one end of each of said two vibration legs and one end of said central leg; and
a protrusion portion that is coupled to another end of said central leg, has a predetermined angle to the length direction of the central leg, and extends into a direction not interfering with said vibration legs, said predetermined angle excluding 0 degree and 180 degrees wherein
said piezoelectric vibration element is supported and fixed in said package at a support point on said central leg and is electrically conducted to external connection terminals, provided on the side of said package, via two conducting points on said protrusion portion, and
said piezoelectric vibration element is supported and fixed in said package by at least two support points with one support point on said central leg and at least one support point on said protrusion portion.

2. The piezoelectric device according to claim 1 wherein
said piezoelectric vibration element has two protrusion portions extending into both sides of said central leg and
said piezoelectric vibration element is supported and fixed in said package by three points with one support point on said central leg, one support point on one protrusion portion of said two protrusion portions, and one support point on another protrusion portion.

3. The piezoelectric device according to claim 1 wherein the support point on said central leg is within a range in which temperature characteristics of said piezoelectric vibration element are stable.

4. The piezoelectric device according to claim 3 wherein
the support point on said central leg in the stable range of the temperature characteristics is at a position near to said coupling portion in such a way that a distance between the support point and said coupling portion is shorter than a distance that would induce a vibration resonance between the vibration legs and the central leg, said vibration resonance generated when a vibration frequency of the central leg becomes closer to a basic vibration frequency of the vibration legs.

5. The piezoelectric device according to claim 4 wherein
the distance between the support point and said coupling portion is shorter than the distance that would induce a vibration resonance between the vibration legs and the central leg when the vibration frequency of said central leg becomes closest to the basic vibration frequency of said vibration legs within an allowable temperature range in terms of variation characteristics of the vibration frequency of said central leg for a temperature.

6. The piezoelectric device according to claim 3 wherein
the support point on said central leg in the stable range of the temperature characteristics is at a point in a distance where, in terms of variation characteristics of a vibration frequency of the vibration legs with respect the support position on the central leg, the distance between the support point and said coupling portion is in a range where the variation in the vibration frequency is small enough to ignore.

7. The piezoelectric device according to claim 3 wherein the support point on said central leg is at a position where a distance between the support point and said coupling portion is long enough to ignore an increase in a CI value with respect to the support position on the central leg.

8. The piezoelectric device according to claim 3 wherein the support point on said central leg in the stable range of the temperature characteristics is at a position near to said coupling portion in such a way that a distance between the support point and said coupling portion is shorter than a distance that would induce a vibration resonance between the vibration legs and the central leg generated when a vibration frequency of the central leg becomes closer to a basic vibration frequency of the vibration legs and, at the same time, at a position where, in terms of variation characteristics of a vibration frequency of the vibration legs with respect to the support position on the central leg, the distance is in a range where the variation in the vibration frequency is small enough to ignore.

9. The piezoelectric device according to claim 3 wherein the support point on said central leg in the stable range of the temperature characteristics is at a position that is near to said coupling portion in such a way that a distance between the support point and said coupling portion is shorter than a distance that would induce a vibration resonance between the vibration legs and the central leg generated when a vibration frequency of the central leg becomes closer to a basic vibration frequency of the vibration legs and, at the same time, at a position where the distance is in a range where an increase in a CI value with respect to the support position on the central leg is small enough to ignore.

10. The piezoelectric device according to claim 1 wherein said package comprises:
at least two mounting portions electrically connected to an external connection terminal formed in the package; and
at least one supporting portion that is electrically insulated from said external connection terminal wherein
said piezoelectric vibration element is supported and fixed in the package by said mounting portions and said supporting portion.

11. The piezoelectric device according to claim 10 wherein said package further comprises:
a pedestal on which said piezoelectric vibration element is mounted and
said pedestal comprises:
a mounting stand where an electrode is formed on a surface thereof on which said mounting portion is formed; and
a projection that forms said supporting portion and
at least one of said mounting stand and said projection is integrally formed with said package.

12. The piezoelectric device according to claim 10 wherein at least one of said mounting portions and said supporting portion is made of a thin film or a plating material formed on said package.

13. The piezoelectric device according to claim 10 wherein said piezoelectric vibration element is supported and fixed on said mounting portions and said supporting portion using elastic adhesive.

14. The piezoelectric device according to claim 10 wherein said piezoelectric vibration element is supported and fixed on said mounting portions and said supporting portion using a metal bump.

15. The piezoelectric device according to claim 10 wherein the cross section of at least one of said mounting portions and said supporting portion is concave or convex.

16. The piezoelectric device according to claim 10 wherein said supporting portion is structured in such a way that the surface thereof is covered by an insulating material.

17. The piezoelectric device according to claim 10 wherein said piezoelectric vibration element is supported and fixed on said supporting portion using insulating adhesive.

18. The piezoelectric device according to claim 1 wherein a configuration member of said package is a semiconductor.

19. The piezoelectric device according to claim 1 wherein said piezoelectric vibration element is a tuning-fork type quartz crystal vibration element having a vibration portion and a fixed portion and
said vibration portion has said vibration leg and said fixed part has said central leg.

20. The piezoelectric device according to claim 8 wherein said protrusion portion is supported and fixed by two of said mounting portions and said central leg is supported and fixed by said supporting portion.

* * * * *